March 16, 1971 W. T. REYNOLDS ET AL 3,570,118

METHOD OF PRODUCING COPPER CLAD SUPERCONDUCTORS

Filed March 10, 1967

WITNESSES

Bernard R. Gregory

James F. Young

INVENTORS
William T. Reynolds and
Russell M. Schrecengost.
BY
H. W. Snyder
ATTORNEY 3,570,118
Patented Mar. 16, 1971

3,570,118

METHOD OF PRODUCING COPPER CLAD SUPERCONDUCTORS

William T. Reynolds, McMurray, and Russell M. Schrecengost, Murrysville, Pa., assignors to Westinghouse Electric Corporation, Pittsburgh, Pa.

Filed Mar. 10, 1967, Ser. No. 622,266
Int. Cl. H01v *11/00*
U.S. Cl. 29—599 2 Claims

ABSTRACT OF THE DISCLOSURE

Copper cladding is provided on alloy or compound superconductors such as niobium containing materials in strip or wire form by bonding the super conductive material to the copper through an intermediate aluminum bonding layer. Aluminum foil is placed about the superconductive material and then inserted into a copper sheath and bonding occurs in the rolling thereof or drawing it into the wire. Heat treatment is subsequently employed to improve the superconductive properties of the alloy or to react the constituents to form the superconductive compound.

BACKGROUND OF THE INVENTION

This invention is directed primarily to methods for producing copper-clad niobium-containing superconductor elements.

In recent years superconductive solenoids have been successfully made which are capable of developing magnetic fields substantially in excess of 50,000 gauss. These superconductive solenoids are wound with superconductive alloy wire made from the alloys of niobium-zirconium or niobium-titanium or from wires containing superconductive compounds such as $Nb_3Sn$. Much experience has now been accumulated in the design, development and manufacture of high-field superconducting solenoids and it has been found that superconductive wire clad with high conductivity copper is required for the success of such high-field superconductive solenoids. A superconductive wire or strip used in such coils must be protected by a parallel contiguous metal having very high electrical and thermal conductivities such as silver, copper or aluminum. For all practical purposes, high cost and scarcity eliminates silver as a protective metal in composite superconductive wires. The difficulty of making good electrical joints together with a substantially lower conductivity relegates aluminum to second choice after copper as the protective metal in superconductive composites.

At present the alloy superconductors are protected by a 0.001 to 0.002 inch electroplated coating of copper. There are several disadvantages and limitations in the use of such a coating. For example, the interfacial resistance is undesirably high. Plating quality in terms of interfacial resistance and strength of bond are variable from wire to wire and even along a given wire. Thickness of the plating is limited to a maximum of about 0.002 inch although greater thicknesses are desirable. Copper plating of niobium-titanium or niobium-zirconium is slow and expensive. Taken all together, these various shortcomings limit the present design of superconducting solenoids to sizes or configurations which involve less than 65,000 feet of copper-plated 0.010 inch diameter niobium-40 weight percent titanium wire or its equivalent expressed in terms of total stored energy. Demand already exists for larger coils capable of much greater stored energy values.

The use of superconductive intermetallic compounds presents its own difficult problems despite the fact that such compounds have superconductive properties superior to the alloy superconductors. Lack of fabricability is a severe limitation to utilization of such compounds. Both fabrication and utilization of these superconductors have generally been considered in terms of making a very long conductor such as is commonly done with the ductile niobium-titanium or niobium-zirconium alloy by wire drawing or rolling techniques. Brittleness of the intermetallic compounds has been accommodated in the making of long conductors by four methods which are:

(1) To elongate the intermetallic compound components into a long composite wire, coil the wire into a solenoid, and heat treat the solenoid at elevated temperatures to form the superconductive compounds;

(2) To coat niobium strip or wire by hot dipping in a tin bath, insulating the coated conductor, winding the conductor into a solenoid and heat treating it at elevated temperature to form the superconductive compound;

(3) Coating niobium ribbon by hot dipping in tin at 900 to 1000° C. to form a $Nb_3Sn$ diffusion layer, insulating the ribbon, and winding it into a solenoid; or (4) To deposit a thin layer of superconductive compound upon a suitable substrate such as niobium, platinum, or nickel base high temperature alloy in a continuous elevated temperature vapor transport process.

Provision of the necessary copper in superconductors or conductors made by the process outlined above creates manufacturing problems. For example, if a copper sheath is substituted for the nickel-base alloy sheath normally applied in method (1) above as a container for the components of the intermetallic compounds, serious difficulty in wire-drawing results due to the insufficient tensile strength and also serious loss of coil packing factor due to limited ability to increase critical current of such wire. With thin ribbons, wires or cables made by method (2) or (3) copper must be soldered onto the surface in a separate operation after hot-dipping and diffusion heat treatment to avoid hamful mutual alloy of copper and tin. Method (4) above poses a similar problem in that copper is neither compatible with 1000° C. vapor-transport deposition of $Nb_3Sn$ nor capable of being added to finished ribbon as an electroplated coating of sufficient conductivity or thickness; hence again it can only be applied separately by a tedious soldering operation. In summary, the prime requisites of mechanical flexibility, high ratio of critical current to composite cross-sectional area both thermal and electrical protection with copper, ease of electrical insulation, and acceptable cost, so far have not been successfully combined in any $Nb_3Sn$ superconductor composite.

SUMMARY OF THE INVENTION

In this invention a superconductive material is enclosed within a copper cladding which is bonded to the superconductive material through an intermediate continuous aluminum bonding layer. The superconductive material may be an alloy such as niobium-titanium or niobium-zirconium, in which case a member of the alloy is wrapped in aluminum foil and then enclosed in a copper sheet and the composite assembly is rolled or drawn to bond the copper to the alloy through the intermediate layer of aluminum. Alternatively, the superconductive material may be a brittle compound such as $Nb_3Sn$, in which case a copper or copper alloy member is used as a core for winding alternate sheets of niobium and tin thereabout to provide a substantial buildup. Aluminum foil is then wound about this composite member and then the wrapped member is placed in a copper sheath. This assembly is drawn to wire, thereby bonding the copper sheet to the outermost layer of niobium through the intermediate aluminum layer, and subsequently it is heat treated to react the alternate sheets of niobium and tin to form $Nb_3Sn$.

It is another object of this invention to provide a method for bonding a copper cladding to superconductive material.

Other objects of the invention will, in part, be obvious and will, in part, appear hereinafter.

BRIEF DESCRIPTION OF THE DRAWINGS

For a better understanding of the nature and objects of this invention, reference should be had to the following detailed description and of the drawings, in which.

DESCRIPTION OF THE PREFERRED EMBODIMENTS

(A) The alloy superconductor

Figure 1:
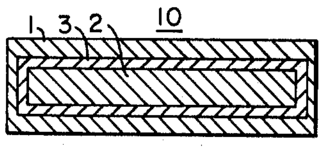
FIG. 1 is a cross-sectional view of an alloy superconductor prepared for roll bonding to a copper cladding.

The following sequence of operations was used to clad copper upon niobium-52% titanium alloy by cold rolling composites of these metals. Reference should be had to FIG. 1 of the drawings.

(1) Box-shaped enclosures 1 of OFHC copper were prepared by machining, degreasing, and acid pickling. Bottoms and tops of enclosures were ⅜ inch thick; sidewalls were ⅛ inch thick.

(2) Pieces of niobium-52% titanium alloy 2 were prepared by machining to ¼" x 1⅛" x 1¼", degreasing and pickling in a solution of 1 $HF:3HNO_3:5H_2SO_4$.

(3) The niobium-52% titanium pieces were wrapped in one layer of clean, dry (degreased) aluminum foil 3, the foil being 0.001 inch thick.

(4) Each foil-wrapped piece was placed in the copper enclosure.

(5) The copper enclosures were sealed by electron beam welding within a vacuum of $5.0\times10^{-5}$ mm. Hg or less to complete the assembly of the alloy composites. The general appearance of the completed assembly 10 is shown in FIG. 1.

(6) The composites were cold rolled on 2 high mills having 8 inch and 5 inch diameter rolls. In the cold rolling the alloy composite underwent a reduction in area amounting to 98.7%, the sheet having a final thickness of 0.013".

Specimens of the copper-clad niobium 52% titanium alloy were electro-discharge machined with axes parallel and axes perpendicular to the direction of rolling. The specimens were tested for critical current as a function of applied magnetic field at 4.2° K. Results are summarized in Table I.

TABLE I

[Cu-clad Nb-52 w/o Ti alloy strip (with 99.82% cold work in alloy]

| Orientation with rolling direction | Orientation with applied field | Applied field (kilogauss) | Critical current desity (amperes/cm.$^2\times10^4$ Cu etched off) |
|---|---|---|---|
| | Longitudinal specimen | | |
| Parallel | Parallel | 20 | 0.99 |
| Do | do | 30 | 0.84 |
| Do | do | 40 | 0.72 |
| Do | do | 50 | 0.84 |
| Do | Perpendicular | 0 | 5.32 |
| Do | do | 20 | (1) |
| Do | do | 30 | (1) |
| Do | do | 40 | (1) |
| Do | do | 50 | (1) |
| | Transverse specimen | | |
| Perpendicular | Parallel | 20 | 1.93 |
| Do | do | 30 | 1.81 |
| Do | do | 40 | 1.71 |
| Do | do | 50 | 1.58 |
| Do | Perpendicular | 0 | 4.62 |
| Do | do | 20 | (1) |
| Do | do | 30 | (1) |
| Do | do | 40 | (1) |
| Do | do | 50 | (1) |

[1] Resistive.

The critical current versus applied field behavior of this niobium-titanium strip is generally comparable to strip cold rolled the same amount without copper cladding.

Figure 2:
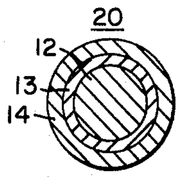
FIG. 2 is a view of an alloy superconductor similar to that of FIG. 1 prepared for wire drawing to bond copper cladding to the alloy superconductor.
Figure 3:
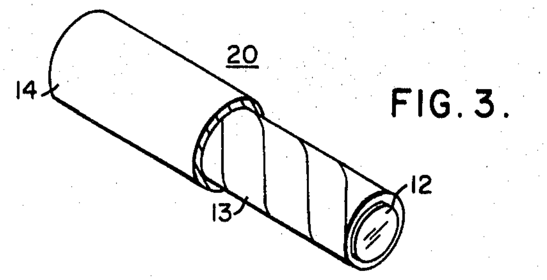
FIG. 3 is a perspective view of an alloy superconductor wrapped in aluminum foil, the whole inserted into a copper tube (shown cut away); and, FIG. 4 is a perspective view showing the method for winding tin and niobium sheets in the preparation of a superconductive element employing a superconductive compound.

The following description is directed to a cold drawing procedure which was used to clad copper upon niobium-52% titanium alloy to form a superconductive wire; and reference should be had to FIGS. 2 and 3 of the drawings:

(1) A piece of niobium-52% titanium alloy rod 12 cold worked 94.5% was prepared by straightening, lathe turning, degreasing and pickling in $2HF:4HNO_3:4H_2SO_4$ acid solution the parts of each acid being by volume.

(2) The alloy rod 12, 0.467"±0.003" dia.×41.5" long was spirally wrapped with three layers of clean, dry aluminum foil 13. The wrapped rod is shown in section in FIG. 2 and in perspective in FIG. 3.

(3) The foil-wrapped rod 12 was inserted into a 0.750" outside diameter and 0.500" inside diameter times 42" long seamless hard copper tube 14 which had been prepared by degreasing and pickling in a solution of 10% by volume of concentrated sulfuric acid in water. The completed assembly 20 is shown in cross-section in FIG. 2 and in broken perspective in FIG. 3.

(4) The copper tube-aluminum foil-alloy rod composite was fabricated into wire by cold drawing operations using tungsten carbide dies. A total reduction in area of 99.97% was achieved. After being cold drawn to find size the wire was degreased, sampled and spooled. Superconductivity tests of critical current versus applied field yielded the data as presented in Table II.

TABLE II

[Critical current at 4.2° K. of copper clad Nb-52 w/o Ti wire [1]]

| Wire piece No. | Piece end | Sample | Condition: Core | Condition: Cladding | Critical current amperes at applied field (kilogauss): 0 | 10 | 20 | 30 | 40 | 50 |
|---|---|---|---|---|---|---|---|---|---|---|
| 1 | A | 1a | As drawn | Etched off | 60.0 | 6.4 | 4.1 | 3.0 | 2.8 | 3.0 |
| | | 1b | do | As drawn | 60.0 | 9.0 | 5.0 | 3.8 | 3.5 | 4.0 |
| | | 1c | H.t. 400° C×5.5 hrs | Etched off | 200 | 156.0 | 87.0 | 57.0 | 40.0 | 29.0 |
| | | 1d | H.t. 400° C.×5.5 hrs | As h.t. | | 156 | 88.5 | 58.0 | 41.0 | 30.0 |
| 1 | B | 2a | As drawn | Etched off | 67.0 | 6.7 | 5.0 | 3.7 | 3.4 | 4.0 |
| | | 2b | do | As drawn | 69.0 | 8.5 | 5.6 | 4.1 | 3.7 | 4.1 |
| | | 2c | H.t. 400° C.×5.5 hrs | Etched off | | 152.0 | 89.5 | 58.5 | 40.5 | 29.5 |
| | | 2d | H.t. 400° C.×5.5 hrs | As h.t. | | | | | | |
| 2 | C | 3a | As drawn | Etched off | 31.0 | 6.6 | 4.8 | 3.6 | 3.2 | 3.7 |
| | | 3b | do | As drawn | | | | | | |
| | | 3c | H.t. 400° C.×5.5 hrs | Etched off | | 146.0 | 85.0 | 55.0 | 39.0 | 28.0 |
| | | 3d | H.t. 400° C.×5.5 hrs | As h.t. | | | | | | |
| 2 | D | 4a | As drawn | Etched off | | 6.7 | 4.4 | 3.2 | 3.2 | 3.6 |
| | | 4b | do | As drawn | | | | | | |
| | | 4c | H.t. 400° C.×5.5 hrs | Etched off | | 156.0 | 88.0 | 57.0 | 40.0 | 29.0 |
| | | 4d | H.t. 400° C.×5.5 hrs | As h.t. | | | | | | |
| 7 | M | 13a | As drawn | Etched off | 59.0 | 6.2 | 4.2 | 3.4 | 3.1 | 3.6 |
| | | 13b | do | As drawn | 66.0 | 8.5 | 4.9 | 3.8 | 3.3 | 4.0 |
| | | 13c | H.t. 400° C.×5.5 hrs | Etched off | 110.0 | 75.0 | 57.0 | 43.5 | 33.2 | 26.0 |
| | | 13d | H.t. 400° C.×5.5 hrs | As h.t. | 99.0 | 76.0 | 58.5 | 45.0 | 35.6 | 27.2 |
| 7 | N | 14a | As drawn | Etched off | 62.0 | 6.7 | 5.2 | 4.1 | 4.0 | 4.6 |
| | | 14b | do | As drawn | 65.0 | 7.2 | 5.4 | 4.2 | 4.9 | 4.6 |
| | | 14c | H.t. 400° C.×5.5 hrs | Etched off | | 152.0 | 88.0 | 57.0 | 40.0 | 29.0 |
| | | 14d | H.t. 400° C.×5.5 hrs | As h.t. | | | | | | |

[1] 0.0139 O.D. × 0.010″ diameter core; Nb-52 w/o Ti core received 99.998% penultimate cold reduction in area during processing from ingot to final copper clad wire.

Note that in the drawn condition the alloy wire specimens had low but uniform values of critical curent. However, upon heat treatment critical current is significantly increased uniformly among the various specimens tested. The heat treatment employed is disclosed in U.S. Pat. No. 3,268,373, issued Aug. 23, 1966 to W. T. Reynolds. Determination of optimum heat treatment in the present case was carried out by the heat treatment of series of specimens at various times and temperatures in an inert atmosphere. Results are shown in Table III. These results show that maximum critical current at 50 kilogauss is obtained by heat treatment of the wire at 400° C. for at least about ¼ hour and that good results can be obtained at high temperatures with heat treatment for periods of ¼ hour and less.

TABLE III

[Critical current at 4.2° K. of heat treated copper-clad Nb-52 w/o Ti wire [1]]
Critical current (amperes) of short samples at—

| Applied field (kilogauss) | 300° C. ¼ | 1 | 4 | 16 | 400° C. ¼ | 1 | 4 | 16 | 500° C. ¼ | 1 | 4 | 16 | 600° C. ¼ | 1 | 4 | 16 |
|---|---|---|---|---|---|---|---|---|---|---|---|---|---|---|---|---|
| 10 | | 40 | 36 | 81 | 90 | 140 | 174 | 150 | 130 | 122 | 98 | 79 | 40 | | | |
| 20 | | 28 | 25 | 56 | 64 | 94 | 106 | 112 | 71 | 62 | 53 | 39 | 18 | | | |
| 30 | | 22 | 20 | 45 | 52 | 70 | 75 | 80 | 46 | 38 | 32 | 22 | 10 | | | |
| 40 | | 19 | 17 | 37 | 42 | 54 | 55 | 57 | 32 | 26 | 20 | 14 | 6 | | | |
| 50 | | 16 | | 31 | 34 | 41 | | 42 | 23 | 17 | 13 | 9 | 4 | | | |

(Time at temperature (hours))

[1] See footnote at end of Table II.

Over 2000 feet of wire were heat treated at 400°±4° C. for 4¼ hours, insulated and wound into a small test coil of the same configuration as that previously used to evaluate this same wire in the drawn condition. Short samples taken from the heat treated wire yielded the data of Table IV. The test coil carried 36 amperes, generated a field of 50 kilogauss and was able to be energized to 36 amperes within 15–20 seconds. Such performance represents for small coils, a significant improvement over typical bare-drawn, copper electroplated niobium-50% titanium wire.

TABLE IV

[Critical current at 4.2° K. of copper-clad Nb-52 w/o Ti wire [1] heat treated for coil evaluation (heat treated in argon atmosphere for 4¼ hours at 400° C±4°C.)]

| Applied field (kilogauss) | Critical current (amperes): Cu-clad | Cu-cladding etched off. |
|---|---|---|
| 10 | 140 | |
| 20 | 97 | 97 |
| 30 | 72 | 73 |
| 40 | 54 | 57 |
| 50 | 41 | 43 |

[1] Same wire as used for data in Tables II and III.

The importance of the heat treatment required to enhance critical current of copper-clad niobium-titanium wire lies in the fact that the highly variable, difficult-to-control multiple oxidation heat treatments heretofore given bare niobium-titanium wire in order to adequately draw it can now be replaced with a single well-controlled heat treatment after the final draft of the wire.

An important advantage of drawn copper cladding on the alloy superconductor is that costly electroplating is eliminated. Therefore defects in insulation resulting from roughness, poor adhesion, and porosity of copper platings are eliminated. Insulation of about 3000 ft. of copper-clad niobium-titanium wire has shown that the insulation quality is superior to that of copper plated wire; and it is similar in quality and in ease of insulation to plain copper wire. While the invention, as applied to alloy superconductors, has been described using niobium-titanium alloys as an example, it will be understood that superconductive alloys such as the titanium-vanadium system can be employed as well since aluminum has substantial solubility in vanadium and thus copper cladding is readily bonded to vanadium alloys.

(B) Copper cladding the superconductive compound

The materials used in making a composite rod for drawing were:

(a) copper pipe 1.375″ O.D. x 1.016″ I.D. x 33″ long,
(b) copper rod OFHC grade 0.500″ diameter x 36″ long,
(c) aluminum foil and niobium-1% zirconium alloy sheet, electron beam melted grade (recrystallized) and tin foil, 99.99% pure, 0.004″ x 11″ x 33″.

Figure 4:
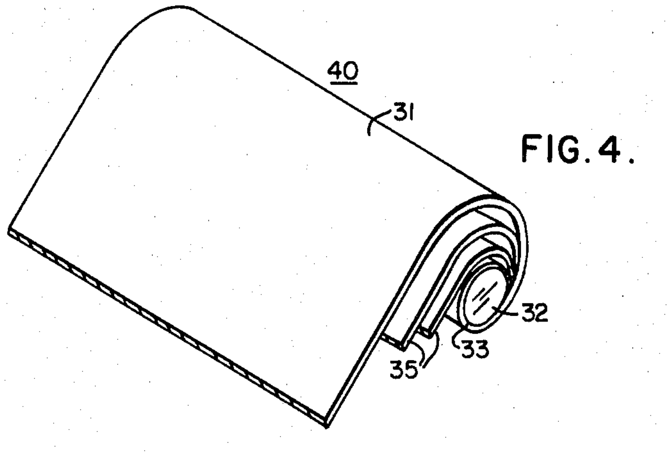

The following sequence of operations was employed to make a copper-clad spirally coiled $Nb_3Sn$ composite superconductor. Reference should be had to FIG. 4 of the drawings.

(1) Niobium-1% zirconium sheet 31 was tangentially spot welded to the copper rod 32 along its length.

(2) Ends of the copper rod were supported in a coiler so that it could be slowly rotated as tension was applied to the sheet to obtain a tight wrapping of the sheet around the copper rod.

(3) One complete wrap 33 of the niobium-zirconium alloy sheet was made.

(4) Two layers of tin foil 35 were placed on the niobium-1% zirconium sheet.

(5) The niobium-1% zirconium sheet and the tin foil were together wrapped upon themselves as shown in FIG. 4 in successive layers as the copper rod was revolved. Thereby a cylinder 1 inch in diameter by 33 inches long comprised of spirally coiled alternate layers of niobium-1% zirconium alloy sheet and the tin foil was obtained. The niobium-1% zirconium sheet which was wider than the tin foil provided an extra ⅔ turn upon itself beyond the end of the last tin layer. The purpose of the niobium-1% zirconium layer-to-layer contact was to cause cold bonding of the niobium-1% zerconium to itself thereby sealing the tin within the coiled layers. After coiling the cylinder was clamped temporarily with hose clamps.

(6) The cylinder was wrapped with one layer of 0.001 inch aluminum foil (not shown) as it was unclamped and inserted into the 1.016 inch inside diameter copper pipe (not shown but similar to showing of FIG. 3) to complete the assembly of the composite.

(7) One end of the composite was pointed by rotary cold swaging to permit entry into the die.

(8) The composite was cold drawn to wire using tungsten carbide dies to a total reduction in area of 99.8%. In the course of the drawing operation a sample of the composite wire was taken for micrographic examination. A mechanical polishing technique revealed the existance of discrete continuous layers of niobium and tin in both transverse and longitudinal sections.

Also in the course of the cold drawing a sample of the composite wire (0.1224" diameter) was heat treated in a protected atmosphere of helium for 20 hours at 900 to 910° C., cooled 50° C. per hour to 700° C., and furnace cooled to room temperature. It was found that the heat treated composite superconductor was not only very rigid but also very difficult to fracture by bending or impact. The heat treatment had greatly increased the strength of the composite without causing objectionable loss of ductility. It appears that the intermetallic compound layer, $Nb_3Sn$, formed during the treatment serves as both a superconductor and a fiber strengthener. That is, one may suppose that the $Nb_3Sn$ is a continuous high modulus "fiber" (actually a film) aligned parallel to the tension axis of the ductile low modulus copper matrix. Consequently load is transferred from the matrix to the film by shear stresses at their interface and thereby reenforcement of copper results. Such reenforcement, without loss of electrical or thermal conductivity of the copper matrix, presents achievement of both the protection and the mechanical strength required for high field coils.

In order to determine the superconducting behavior of the heat treated composite a sample was etched in nitric acid to remove the copper sheath, clamped firmly between indium coated copper terminals of a critical-current test fixture and tested in liquid He (4.2° K.) within an applied magnetic field up to 60 kilogauss. It was not possible to drive the specimen normal with the maximum available current (304 amperes) at applied fields up to the maximum available field of 60 kilogauss. Calculated critical current is at least 3650 amperes based on previously measured critical current density ($2.34 \times 10^6$ amp./cm.$^2$) of $Nb_3Sn$ similarly formed from Nb-1 w/o zirconium alloy sheet plus 99.99% Sn and the ideal interfacial area between the Nb-1 w/o Zr and Sn layers of the composite.

While the invention has been described using a niobium $Nb_3Sn$ composite as an example, it should be understood that composites of vanadium-$V_3Ga$ or vanadium-$V_3Si$ may also be employed. As indicated previously alumina has considerable solid solubility in vanadium and therefore can be used to bond copper cladding to vanadium-$V_3Ga$ or vanadium-$V_3Si$ composites.

There has thus been shown in the above description an economical method for manufacturing in the required long lengths, by a proven cold wire-drawing process followed by heat treatment and slowing cooling in protected atmosphere, an intermetallic compound superconductor. The raw materials for the process are commercially available inexpensive aluminum foil, tin foil, copper pipe, and niobium-1% zirconium alloy sheet. Since the copper has a greater coefficient of thermal expansion than either niobium or $Nb_3Sn$ the external copper sheet tends to put the internal layers of niobium and $Nb_3Sn$ in compression upon cooling from the $Nb_3Sn$-forming heat treatment, and upon subsequent cooling to liquid helium temperatures as well. Therefore, thermal shock resistance is increased while the impact and notch sensitivity are decreased in the composite. Since the $Nb_3Sn$ layer is formed by diffusion within high impurity niobium-1% zirconium and tin without the extraneous interstitial impurities of carbon, oxygen or nitrogen normally encountered in power metallurgy or hot dipped-coating methods, the extreme brittleness of the $Nb_3Sn$ formed by the prior art process is ameliorated to some extent.

It will be understood by those skilled in the art that although the present invention has been described in connection with preferred embodiments, modifications and variations may be employed without departing from the essential spirit and scope of the invention. It is intended to claim all such modifications and variations.

We claim as our invention:

1. A method for making a copper-clad superconductive element which comprises forming a composite assembly wherein the superconductive material is surrounded by a thin aluminum element and placing the aluminum-covered superconductive material within a copper sheath and cold working the assembly to achieve a high reduction in area and thereby bond the copper to the superconductive material through the aluminum layer.

2. A method for making a copper-clad superconductive element which comprises winding sheets of niobium or niobium-base alloy and tin about a central highly conductive core element, the niobium or niobium-base alloy and tin sheets being interleaved and forming contacting spirals about the central element, with the niobium-containing sheet providing the innermost and the outermost turns of the spirals, providing a thin layer of aluminum about the outermost turn of the niobium-containing sheet, inserting the aluminum covered assembly into a copper sheath, cold working the sheathed assembly to achieve a high reduction in area and bond the copper sheath to the niobium-containing sheet through the aluminum layer and heat treating the cold worked material to effect a reaction between the niobium-containing sheet and the tin whereby the superconductive compound $Nb_3Sn$ is formed.

References Cited

UNITED STATES PATENTS

| | | | |
|---|---|---|---|
| 3,109,963 | 11/1963 | Geballe | 29—599 |
| 3,218,693 | 11/1965 | Allen et al. | 29—599 |
| 3,239,919 | 3/1966 | Levi | 29—419 |

JOHN F. CAMPBELL, Primary Examiner

P. M. COHEN, Assistant Examiner

U.S. Cl. X.R.

29—199; 174—102